(12) United States Patent
Kang et al.

(10) Patent No.: US 10,981,301 B2
(45) Date of Patent: Apr. 20, 2021

(54) MOLD FOR WIRE GRID POLARIZER AND MANUFACTURING METHOD THEREOF

(71) Applicant: SAMSUNG DISPLAY CO., LTD., Yongin-si (KR)

(72) Inventors: Min Hyuck Kang, Seoul (KR); Yukihiro Miyazawa, Asan-si (KR); Myeong Hee Kim, Yongin-si (KR); Jung Woo Park, Seoul (KR); Han Su Kim, Seoul (KR); Dong Eon Lee, Hwaseong-si (KR); Gug Rae Jo, Asan-si (KR); Seung-Yeon Chae, Hwaseong-si (KR); Atsushi Takakuwa, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 267 days.

(21) Appl. No.: 16/128,776

(22) Filed: Sep. 12, 2018

(65) Prior Publication Data

US 2019/0232531 A1     Aug. 1, 2019

(30) Foreign Application Priority Data

Jan. 30, 2018 (KR) .................. 10-2018-0011268

(51) Int. Cl.
*B29C 33/38* (2006.01)
*B29C 33/40* (2006.01)
(Continued)

(52) U.S. Cl.
CPC .......... *B29C 33/3807* (2013.01); *B29C 33/40* (2013.01); *B29D 11/00644* (2013.01);
(Continued)

(58) Field of Classification Search
CPC .............. B29C 33/3807; B29C 33/40; B29D 11/00644; G02B 5/3058; G02F 1/133514; G02F 1/133528
See application file for complete search history.

(56) References Cited

U.S. PATENT DOCUMENTS 7,604,836 B2   10/2009   Guo et al.
8,709,317 B2    4/2014   Kaida et al.
(Continued)

FOREIGN PATENT DOCUMENTS

| KR | 10-1652339 | 8/2016 |
| KR | 10-1726625 | 4/2017 |
| KR | 10-1761010 | 7/2017 |

OTHER PUBLICATIONS

Bailey, T.C., et al., "Step and Flash Imprint Lithography: An Efficient Nanoscale Printing Technology", Journal of Photopolymer Science and Technology, vol. 15, No. 3 (2002), pp. 481-486.

*Primary Examiner* — Mathieu D Vargot
(74) *Attorney, Agent, or Firm* — F. Chau & Associates, LLC

(57) ABSTRACT

A mold for a wire grid polarizer includes a hard mold and a soft mold, in which the hard mold includes a main body, an oxidization layer provided on the main body, and a SAM layer provided on the oxidization layer and including an additive, the soft mold includes a substrate, and a protrusions and depressions portion including a polymerized releasing agent, and a region that is hydrophobic in the polymerized releasing agent is arranged on a surface of the protrusions and depressions portion.

19 Claims, 22 Drawing Sheets

(51) Int. Cl.
  *B29D 11/00* (2006.01)
  *G02B 5/30* (2006.01)
  *G02F 1/1335* (2006.01)
  *H01L 27/12* (2006.01)
  *B29K 103/04* (2006.01)
  *B29L 11/00* (2006.01)

(52) U.S. Cl.
  CPC ..... *G02B 5/3058* (2013.01); *G02F 1/133514* (2013.01); *G02F 1/133528* (2013.01); *H01L 27/124* (2013.01); *H01L 27/1248* (2013.01); *B29K 2103/04* (2013.01); *B29K 2995/0034* (2013.01); *B29L 2011/0066* (2013.01); *G02F 2001/133519* (2013.01); *G02F 2001/133548* (2013.01)

(56) References Cited

U.S. PATENT DOCUMENTS

| | | | |
|---|---|---|---|
| 9,713,900 B2 | 7/2017 | Yamada et al. | |
| 2009/0022900 A1* | 1/2009 | Lee | C23C 18/1605 427/466 |
| 2012/0208307 A1* | 8/2012 | Lee | B29C 43/021 438/28 |

* cited by examiner

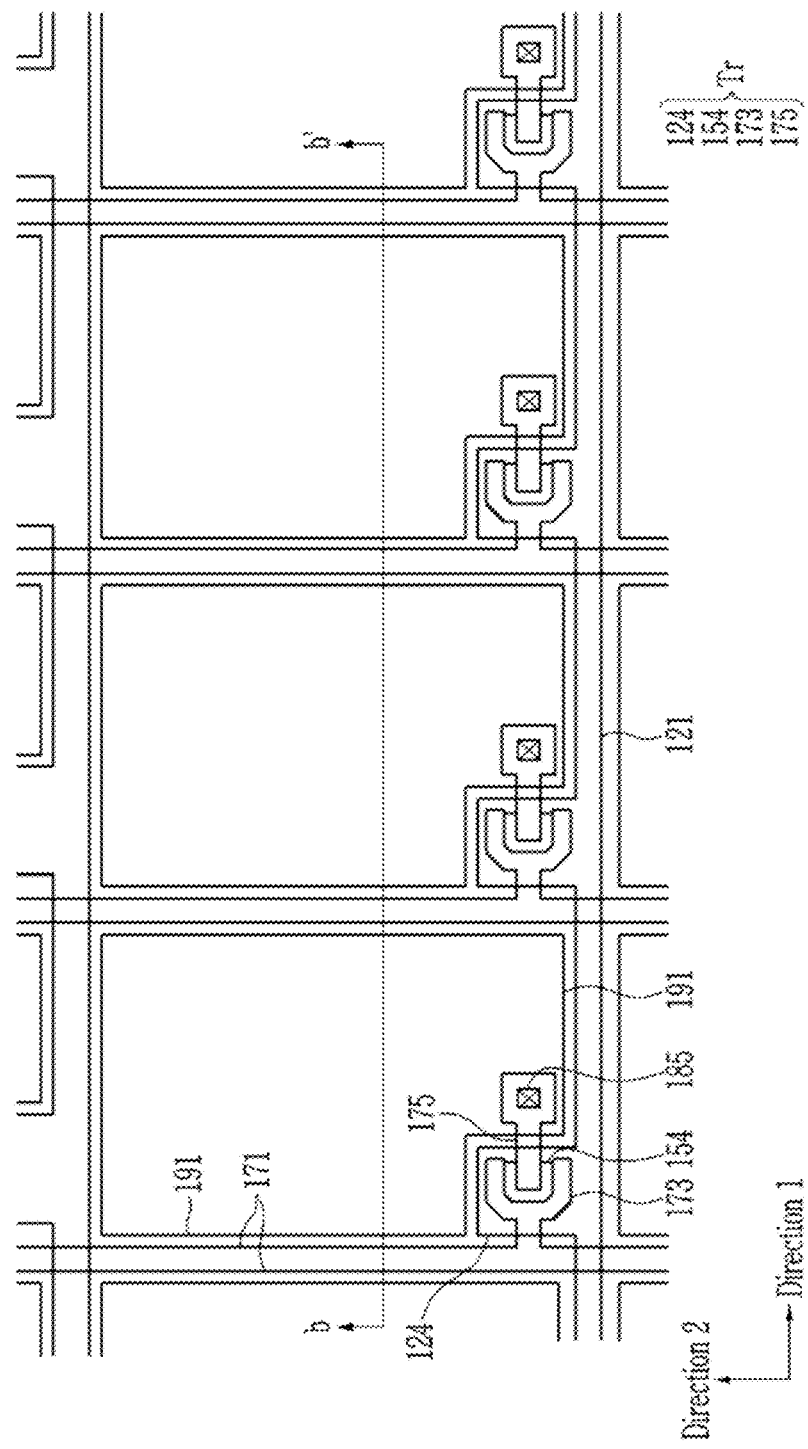

MOLD FOR WIRE GRID POLARIZER AND MANUFACTURING METHOD THEREOF

CROSS-REFERENCE TO RELATED APPLICATION

This application claims priority under 35 U.S.C. § 119 to Korean Patent Application No. 10-2018-0011268 filed in the Korean Intellectual Property Office on Jan. 30, 2018, the entire contents of which are incorporated by reference herein.

TECHNICAL FIELD

The present invention relates to a mold for a wire grid polarizer and a manufacturing method thereof.

DISCUSSION OF RELATED ART

A polarizer is an optical element for separating light having a polarization characteristic according to a specific vibration direction from non-polarized light having the same vibration in all directions, like natural light. To separate the non-polarized light into light with a polarization characteristic, the polarizer has a linear lattice or stripe shape having a pitch that is less than the size of the wavelength of the non-polarized light to be separated.

In general, the polarizer has to have a pitch that is 20% of the wavelength so that it may be used in the visible ray region having the wavelength in a range from about 400 nm to about 700 nm. Therefore, the polarizer with the pitch that is equal to or less than 100 nm to the minimum may be used in the visible ray region.

The above-noted polarizer has a very minute pitch interval, so it is very probable that defects may be generated in the manufacturing process. The defects generated in the manufacturing process may deteriorate the yield of products, and thus may worsen productivity and weaken economic feasibility thereof. Therefore, there is an increasing need of techniques for preventing generation of defects in the process of manufacturing a polarizer.

SUMMARY

Exemplary embodiments of the present invention provide a mold for a wire grid polarizer for increasing productivity by reducing probability of generating defects in a manufacturing process, and a manufacturing method thereof.

An exemplary embodiment of the present invention provides a mold for a wire grid polarizer including a hard mold and a soft mold, in which the hard mold includes a main body, an oxidization layer provided on the main body, and a SAM layer provided on the oxidization layer and including an additive, the soft mold includes a substrate, and a protrusions and depressions portion including a polymerized releasing agent, and a region that is hydrophobic in the polymerized releasing agent is arranged on a surface of the protrusions and depressions portion.

The additive may include a first region that is hydrophilic and a second region that is hydrophobic.

The first region may be provided near the oxidization layer, and the second region may be arranged on a surface of the hard mold.

The oxidization layer may be hydrophilic.

The main body may include at least one of a silicon oxide, a silicon nitride, and a metal.

The protrusions and depressions portion may include the additive.

The additive may include at least one of compounds represented by Formula 1 to Formula 4:

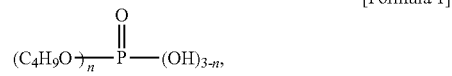

[Formula 1]

[Formula 2]

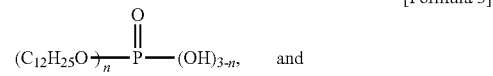

[Formula 3]

[Formula 4]

where n is 1 or 2.

The releasing agent may include at least one of a fluorocarbon oligomer, a fluorocarbon polymer, a siloxane oligomer, and a siloxane polymer.

The oxidization layer may be physically combined with the SAM layer.

Another exemplary embodiment of the present invention provides a method for manufacturing a mold for a wire grid polarizer, the method including: preparing a main body for a hard mold; applying a resin for a soft mold on the main body; and forming the soft mold by curing the resin for the soft mold and separating the soft mold, in which the resin for the soft mold includes a releasing agent and an additive, the additive is arranged near the main body, the releasing agent is arranged by the additive, and the separating of the soft mold includes forming a SAM layer including the additive on the main body.

The method may further include forming an oxidization layer on the main body.

The additive may include a first region that is hydrophilic and a second region that is hydrophobic, and the first region may be arranged to be adjacent to the surface of the oxidization layer.

The releasing agent may include a first region including a photoreactive group and a second region that is hydrophobic, and the second region of the releasing agent may be arranged to be adjacent to the second region of the additive.

While the releasing agent and the additive are arranged, the resin for the soft mold may be cured.

The curing of the resin for the soft mold may include allowing a photoreactive group included by the releasing agent to perform a polymerizing reaction.

The additive may not include a reactive group.

According to the exemplary embodiments, the mold for a wire grid polarizer for manufacturing a wire grid polarizer with the same quality in multiple processes is provided. Deterioration of optical characteristics caused by defects that may be generated in the process for manufacturing a wire grid polarizer may be prevented, and product quality may be enhanced.

BRIEF DESCRIPTION OF THE DRAWINGS

Exemplary embodiments of the present invention will be more clearly understood from the following detailed description taken in conjunction with the accompanying drawings, in which:

FIG. 12A shows a top plan view of a display device including a wire grid polarizer and FIG. 12B shows a cross-sectional view taken along line b-b' of FIG. 12A according to an exemplary embodiment of the present invention;

Figure 1A:
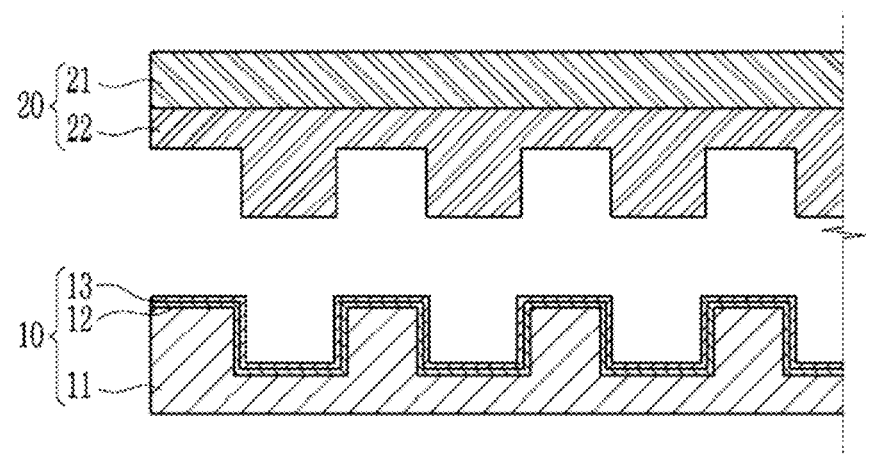
FIG. 1A and FIG. 1B each respectively shows a cross-sectional view of a mold for a wire grid polarizer according to an exemplary embodiment of the present invention.

Since the drawings in FIGS. 1A-20 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

The present invention will be described more fully hereinafter with reference to the accompanying drawings, in which exemplary embodiments of the present invention are shown. As those skilled in the art would realize, the described exemplary embodiments may be modified in various different ways, all without departing from the spirit and/or scope of the present invention.

The drawings and description are to be regarded as illustrative in nature and not restrictive, and like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

Figure 1B:
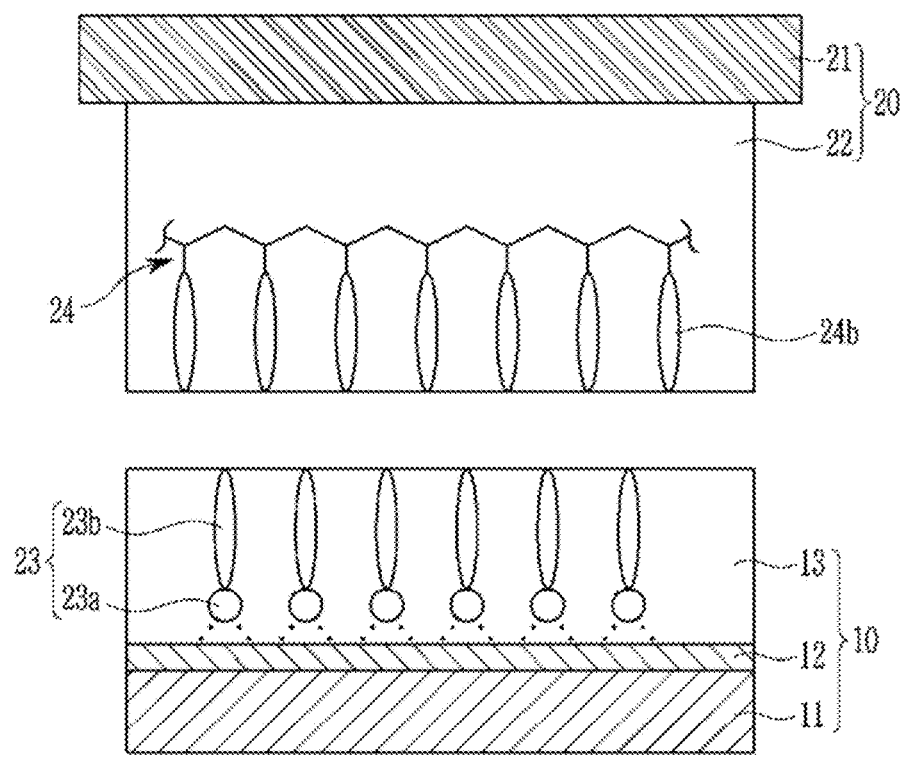

A mold for a wire grid polarizer according to an exemplary embodiment of the present invention will now be described with reference to FIG. 1A to FIG. 4. FIG. 1A and FIG. 1B each respectively shows a cross-sectional view of a mold for a wire grid polarizer according to an exemplary embodiment of the present invention, and FIG. 2, FIG. 3 and FIG. 4 each respectively shows a cross-sectional view of a mold for a wire grid polarizer according to a manufacturing method in an exemplary embodiment of the present invention.

Referring to FIG. 1A and FIG. 1B, the mold for a wire grid polarizer includes a hard mold 10 and a soft mold 20.

The hard mold 10 represents a mold for forming the soft mold 20. The hard mold 10 includes a main body 11, an oxidization layer 12 provided on the main body 11, and a self-assembled monolayer (SAM layer) 13 provided on the oxidization layer 12.

The main body 11 may have a form or shape that corresponds to that of the soft mold 20. For example, the main body 11 may include a recess portion and a convex portion, and the soft mold 20 may include a convex portion and a recess portion corresponding thereto. That is, the pattern on the hard mold 10 may be transferred onto the soft mold 20.

The main body 11 may include at least one of, for example, a silicon oxide ($SiO_2$), a silicon nitride ($SiN_x$) and a metal, however, the present invention is not limited thereto.

The oxidization layer 12 may be a layer formed when the main body 11 is exposed to air. A surface of the oxidization layer 12 may be hydrophilic. The oxidization layer 12 may include an —OH group.

The hard mold 10 may include the SAM layer 13 provided on the oxidization layer 12. The SAM layer 13 may include an additive 23 that is physically combined with a hydrophilic group (e.g., an —OH group) included in the oxidization layer 12. The chemical orientation to be described for the SAM layer 13 on the surface of the oxidization layer 12 may endow high hydrophobicity to the surface of the hard mold 10.

The additive 23 may include at least one of compounds represented by Formula 1 to Formula 4:

[Formula 1]

[Formula 2]

[Formula 3]

and

[Formula 4]

where n is 1 or 2.

The additive 23 includes a first region 23a, that is hydrophilic, and a second region 23b that is hydrophobic. The first region 23a may be disposed to be near the hydrophilic group (e.g., the —OH group) included in the oxidization layer 12, and the second region 23b may be disposed toward the surface of the hard mold 10. The surface of the hard mold 10 may be hydrophobic by the additive 23, especially by the hydrophobic second region 23b of the additive 23, included in the SAM layer 13.

The soft mold 20 includes a substrate 21 and a protrusions and depressions portion 22. The substrate 21 may be combined with the protrusions and depressions portion 22 and may be provided for an imprint process. The substrate 21 may exemplarily be a polyester (PET) film.

The protrusions and depressions portion 22 includes a convex portion and a recess portion. The convex portion and the recess portion may extend in one direction respectively. The convex portion and the recess portion may respectively be disposed in parallel to each other and may have a stripe form or shape.

The protrusions and depressions portion 22 includes a polymerized releasing agent 24. The polymerized releasing agent 24 may include a main chain connected with a first region, which includes a photoreactive group before polymerization, and a second region 24b extending from the main chain. The second region 24b of the releasing agent 24 may be hydrophobic.

The releasing agent 24 may be arranged by the additive 23, for example by the SAM layer 13. The second region 24b of the releasing agent 24 may be provided on the surface of the protrusions and depressions portion 22, that is, the surface of the soft mold 20. The second region 24b of the releasing agent 24 is arranged on the surface of the protrusions and depressions portion 22 and allows the surface of the protrusions and depressions portion 22 to be hydrophobic. For example, the hydrophobic second region 24b of the releasing agent 24 in the soft mold 20 may be arranged to face the hydrophobic second region 23b of the additive 23 in the hard mold 10. By the hydrophobic protrusions and depressions portion 22, an imprinting resin to be described may be easily separated from the soft mold 20 and may be prevented from remaining on the mold or generating a defect. That is, the hydrophobic surface of the soft mold 20 may prevent the attachment of the imprinting resin, which may be hydrophilic, to the surface of the protrusions and depressions portion 22 of the soft mold 20 during separation.

A method for manufacturing a hard mold 10 and a soft mold 20 according to an exemplary embodiment of the present invention will now be described with reference to FIG. 2 to FIG. 4.

Figure 2:
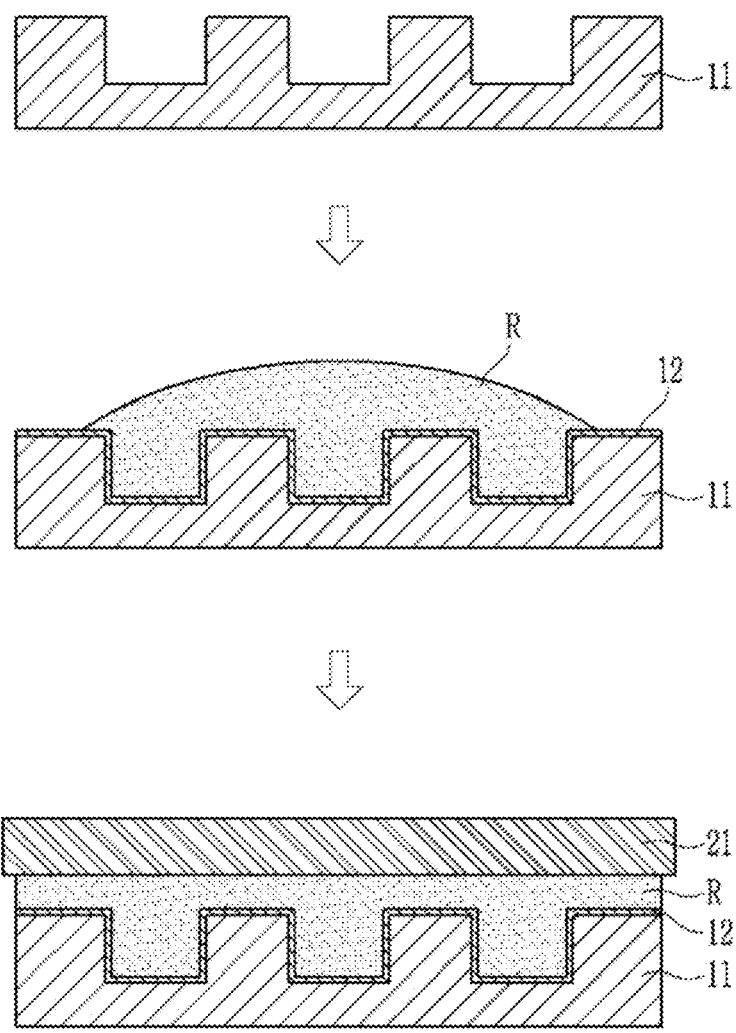
FIG. 2, FIG. 3 and FIG. 4 each respectively shows a cross-sectional view of a mold for a wire grid polarizer according to a manufacturing method in an exemplary embodiment of the present invention.

Referring to FIG. 2, a main body 11 for a hard mold with protrusions and depressions is prepared.

When the main body 11 for a hard mold is exposed, an oxidization layer 12 may be formed on the main body 11 for a hard mold. A resin (R) for a soft mold is applied to the main body 11 for a hard mold.

Figure 3:
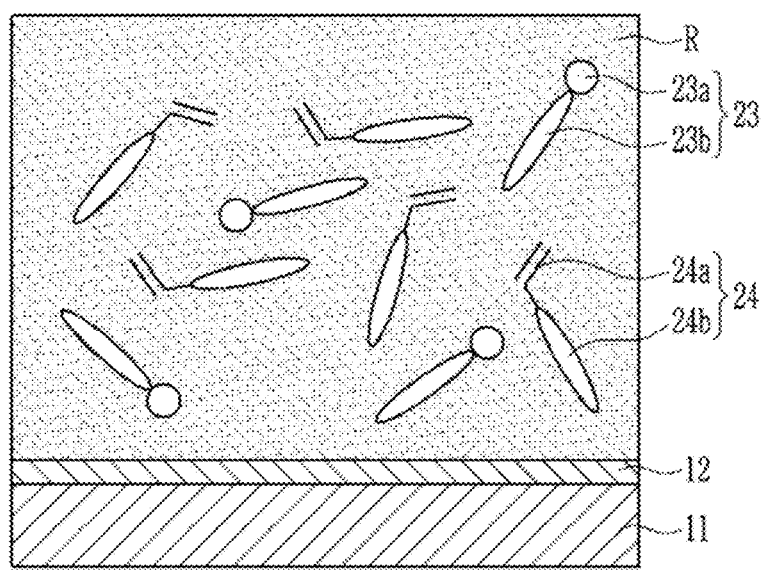
Figure 4:
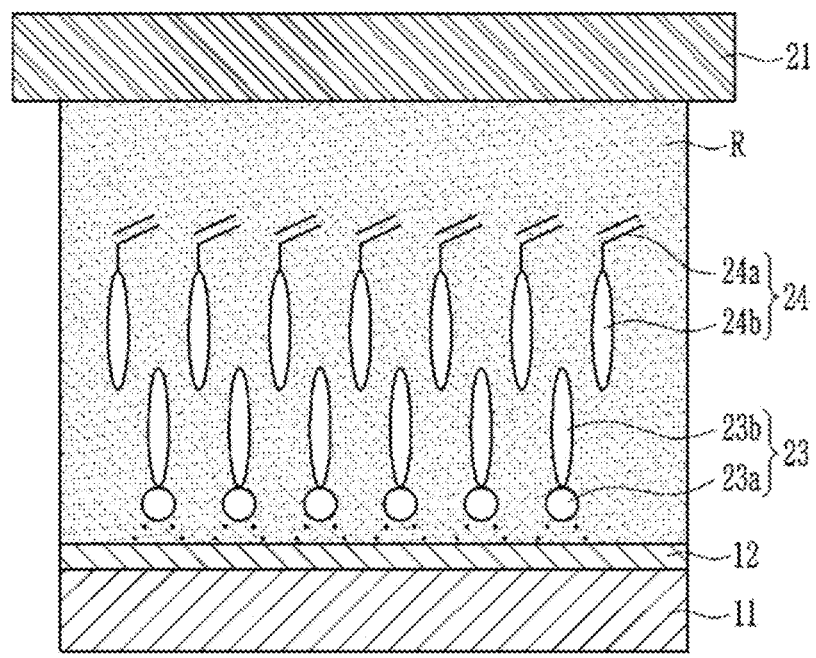

The applied resin (R) for a soft mold may, as shown in FIG. 3, include a SAM additive 23 and a releasing agent 24.

The additive 23 may include at least one of compounds represented by Formula 1 to Formula 4. In Formula 1 to Formula 4, n may independently be 1 or 2.

[Formula 1]

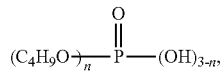

[Formula 2]

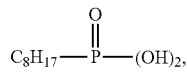

[Formula 3]

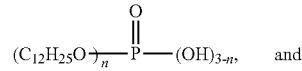  and

[Formula 4]

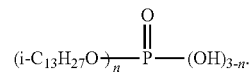

The additive 23 may include a first region 2a that is hydrophilic and a second region 23b that is hydrophobic. Regarding Formulae 1 to 4, the —OH group may be the first region 23a and a carbon chain may be the second region 23b. The additive 23 may be included in a range from about 0.1 to about 10 wt % of the entire content of the resin (R) for a soft mold, for example, at equal to or less than 0.5 wt %.

The releasing agent 24 may include at least one of, for example, a fluorocarbon oligomer, a fluorocarbon polymer, a siloxane oligomer, and a siloxane polymer. The releasing agent 24 may include a first region 24a that is hydrophilic and a second region 24b that is hydrophobic. The first region 24a of the releasing agent 24 may include a photoreactive group. The releasing agent 24 may be included in a range from about 0.1 to about 20 wt % of the entire content of the resin (R) for a soft mold.

The resin (R) for a soft mold may further include a base resin and a photoinitiator. In some instance, a thermal initiator may be used instead of the photoinitiator.

The base resin may include a diacrylate and/or multi-acrylate. For example, the base resin may include at least one of 1,4-butanediol diacrylate, 1,6-hexanediol diacrylate, 1,9-nonanediol diacrylate, 1,10-decanediol diacrylate, 1,6-hexanediol (EO)n diacrylate, hydroxypivalic acid neopentyl glycol diacrylate, dipropylene glycol diacrylate, tripropylene glycol diacrylate, polypropylene glycol diacrylate, diethylene glycol diacrylate, triethylene glycol diacrylate, tetraethylene glycol diacrylate, polyethylene glycol diacrylate, trimethylolpropane triacrylate, trimethylolpropane ethoxylate triacrylate, trimethylolpropane propoxylate triacrylate, ethoxylated glycerine triacrylate, glycerine (PO)n triacrylate, pentaerythritol triacrylate, tris(2-hydroxyethyl) isocyanurate triacrylate, pentaerythritol (EO)n tetraacrylate, ditrimethylolpropane tetraacrylate, pentaerythritol tetraacrylate, dipentaerythritol pentaacrylate, and dipentaerythritol hexaacrylate. The base resin may be included in a range from about 1 to about 90 wt % of the entire content of the resin (R) for a soft mold.

The photoinitiator may include any kind of photoinitiator, and for example, it may include at least one of Irgacure 651, Irgacure 184, Irgacure 1173, Irgacure 2959, Irgacure 127, Irgacure 907, Irgacure 369, Irgacure 379, Irgacure TPO, Irgacure TPO-L, Irgacure 819, Irgacure OXE01, Irgacure OXE02, and Irgacure 784. The photoinitiator may be included in a range from about 1 to about 10 wt % of the entire content of the resin (R) for a soft mold.

The thermal initiators are compounds that generate radicals or cations upon exposure to heat, and thus may be used for heat curing instead of UV curing for the resin (R) for a soft mold. For example, azo compounds such as 2,2'-azobis (isobutyronitrile) (AIBN) and organic peroxides such as benzoyl peroxide (BPO) are well-known thermal radical initiators, and benzenesulfonic acid esters and alkylsulfonium salts have been developed as thermal cation initiators. The thermal initiators may be included in a range from about 1 to about 10 wt % of the entire content of the resin (R) for a soft mold.

The substrate 21 is provided on the resin (R) for a soft mold and is then bonded to the main body 11. In this instance, the additive 23 and the releasing agent 24 included in the resin (R) for a soft mold may be arranged in one direction as shown in FIG. 4. The first region 23a of the additive 23 in the resin (R) for a soft mold may be arranged near the hydrophilic group (—OH) of the oxidization layer 12. The first region 23a that is hydrophilic in the additive 23 may be arranged to be near the main body 11 and the oxidization layer 12, and the second region 23b that is hydrophobic in the additive 23 may be arranged to be near the substrate 21.

The releasing agent 24 may be arranged by the additive 23. The second region 24b that is hydrophobic in the releasing agent 24 may be arranged near the second region 23b of the additive 23, and the first region 24a that is hydrophilic in the releasing agent 24 may be arranged near the substrate 21.

In the above-noted arranged state, a UV curing process is performed. The photoreactive groups included in the releasing agent 24 may be combined with each other and may be polymerized as shown in FIG. 1B through the curing process.

The additive 23 includes no additional reactive group, so it is not combined with the base resin or the releasing agent 24 included in the resin (R) for a soft mold. In the process of separating the cured resin for a soft mold and the substrate 21 from the main body 11, the additive 23 remains as an additional SAM layer 13 on the oxidization layer 12 (refer to FIG. 1B). The hydrophilic first region 23a of the additive 23 in the SAM layer 13 may be arranged near and physically combined with the hydrophilic group (—OH) of the oxidization layer 12, thus the oxidization layer 12 may be physically combined with the SAM layer 13.

By separating the substrate 21 from the main body 11, the soft mold 20 including the substrate 21 and the protrusions and depressions portion 22 including the polymerized releasing agent 24 is manufactured as shown in FIG. 1A and FIG. 1B. Simultaneously, the hard mold 10 including the main body 11, the oxidization layer 12 and the SAM layer 13 is manufactured.

According to an exemplary embodiment of the present invention, the SAM layer 13 with an excellent release force is formed on the surface of the hard mold 10, so it may be easy to separate the soft mold 20 from the hard mold 10. Therefore, peeling off and defects of the manufactured soft mold 20 may be reduced. Further, the SAM layer 13 may be provided on the surface of the hard mold 10 through a simple process. Although the additive 23 includes no additional reactive group and is not combined with the base resin or the releasing agent 24, some of the additive 23 not forming the SAM layer 13 during the separation of the soft mold 20 and the hard mold 10 may be incorporated in the protrusions and depressions portion 22 of the soft mold 20. Thus, the protrusions and depressions portion 22 may include the additive 23.

Figure 5:
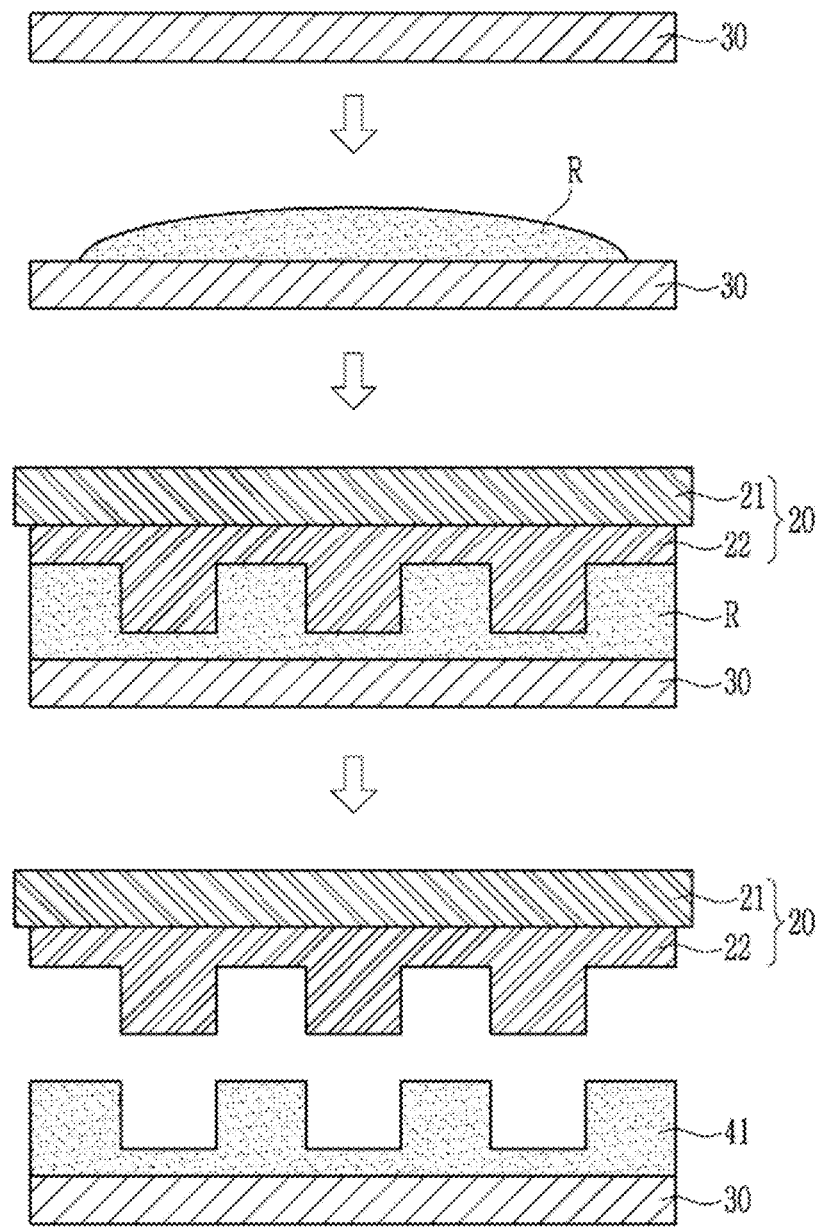
FIG. 5 shows cross-sectional views illustrating a process for manufacturing a mold for a wire grid polarizer according to an exemplary embodiment of the present invention.

A method for manufacturing a wire grid polarizer by using a mold for a wire grid polarizer according to an exemplary embodiment of the present invention will now be described with reference to FIG. 5 to FIG. 11. FIG. 5 shows cross-sectional views illustrating a process for manufacturing a mold for a wire grid polarizer, and FIG. 6, FIG. 7, FIG. 8, FIG. 9, FIG. 10 and FIG. 11 each respectively shows a cross-sectional view illustrating a process for manufacturing a wire grid polarizer.

As shown in FIG. 5, a substrate 30 for pattern transfer is prepared. An imprinting resin (R) is applied to the substrate 30. The soft mold 20 manufactured through the above-described method is bonded to the substrate 30. By the bonding, the imprinting resin (R) may have a shape corresponding to the shape of the soft mold 20. That is, the pattern on the soft mold 20 may be transferred onto the imprinting resin (R).

The imprinting resin (R) is then cured (e.g., cured with heat or UV rays). The soft mold 20 is then removed. The second region 24b that is hydrophobic in the polymerized releasing agent 24 is provided on the surface of the soft mold 20 (refer to FIG. 1B). The soft mold 20 may be easily separated from the imprinting resin (R).

As the soft mold 20 is separated, a layer 41 with a predetermined pattern may be formed on the substrate 30. The layer 41 may be a wire grid polarizer according to an exemplary embodiment of the present invention. For example, the layer 41 may be a mask for forming the wire grid polarizer.

A method for manufacturing a wire grid polarizer will now be described in detail with reference to FIG. 6 to FIG. 11.

Figure 6:
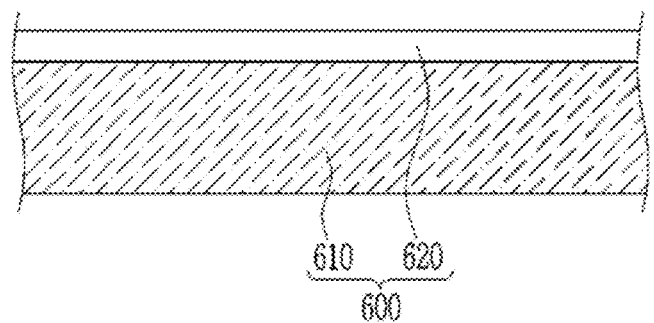
FIG. 6, FIG. 7, FIG. 8, FIG. 9, FIG. 10 and FIG. 11 each respectively shows a cross-sectional view illustrating a process for manufacturing a wire grid polarizer according to an exemplary embodiment of the present invention.

As shown in FIG. 6, a substrate 600 for a wire grid polarizer is prepared. The substrate 600 for a wire grid polarizer may include a metal layer 610 and a metal anti-oxidization layer 620.

The metal layer 610 may include aluminum (Al). The metal anti-oxidization layer 620 may include one or more of a metal such as titanium (Ti) for preventing oxidization of the metal including aluminum, an oxide of such metal, an inorganic material such as a silicon oxide ($SiO_2$) and/or a silicon nitride ($SiN_x$), and an organic material that has low reactivity to oxygen or moisture and prevents oxidization of the metal layer 610.

Figure 7:
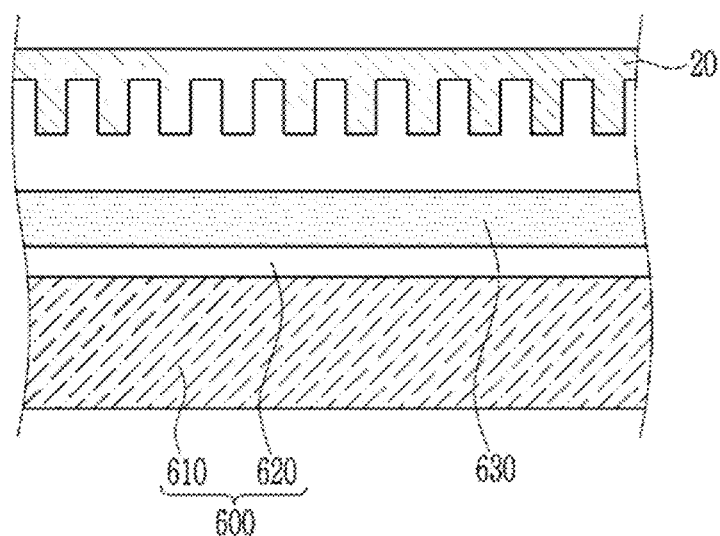

As shown in FIG. 7, an imprinting resin 630 is applied to the substrate 600 for a wire grid polarizer, and the above-noted soft mold 20 is prepared. The imprinting resin 630 is imprinted by the soft mold 20 and is then cured with light or heat. Thereafter, the soft mold 20 is detached.

Without being limited to the above described process, when the imprinting resin 630 having viscosity or intensity that may maintain the imprinted structure is used, after the soft mold 20 is separated from the imprinting resin 630, the imprinting resin 630 may then be cured by heat or light. That is, the soft mold 20 is detached from the imprinting resin 630 before the imprinting resin 630 is cured.

Figure 8:
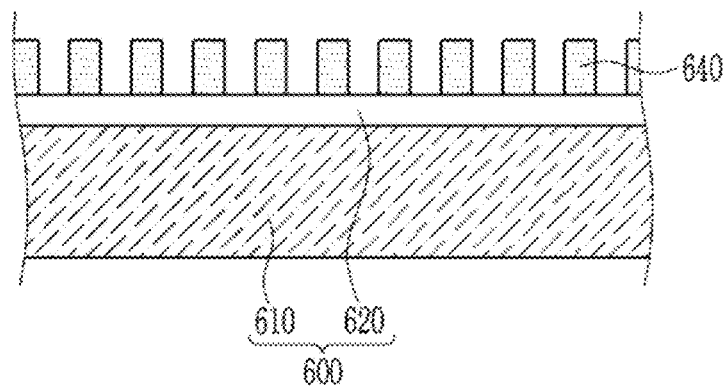

By the above-noted process, as shown in FIG. 8, the mask 640 on which the recess portion and the convex portion are formed in the opposite way of the soft mold 20 is manufactured.

The present exemplary embodiment of the present invention shows a stage for applying a liquefied imprinting resin 630 to the substrate 600 for a wire grid polarizer and performing the imprinting process, but the present invention is not limited thereto. For example, according to an exemplary embodiment of the present invention, the imprinting process may be performed by applying the imprinting resin 630 to the soft mold 20, and then attaching the substrate 600 for a wire grid polarizer to the soft mold 20 to which the imprinting resin 630 is applied. Changes according to the attachment of the substrate 600 for a wire grid polarizer and the order of manufacturing the mask 640 do not limit the performance range of the present invention.

Figure 9:
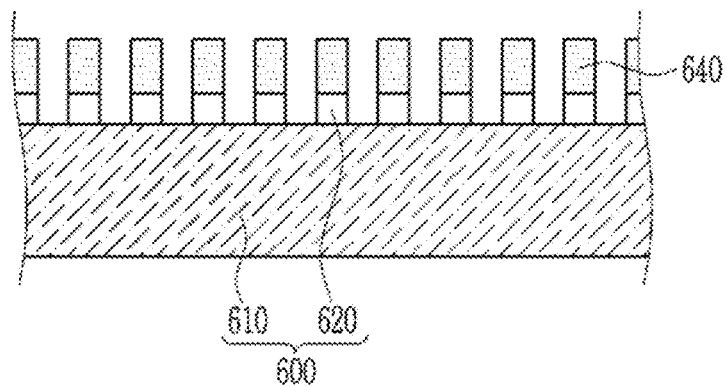

As shown in FIG. 9, the metal anti-oxidization layer 620 is etched with respect to the mask 640. The etching stage may be performed by dry etching, for example, reactive ion etching (RIE), but the present invention is not limited thereto. The process for removing the metal anti-oxidization layer 620, which includes at least one of a metal, a metal oxide, an inorganic material and an organic material, may be included in the performance range of the present invention.

Figure 10:
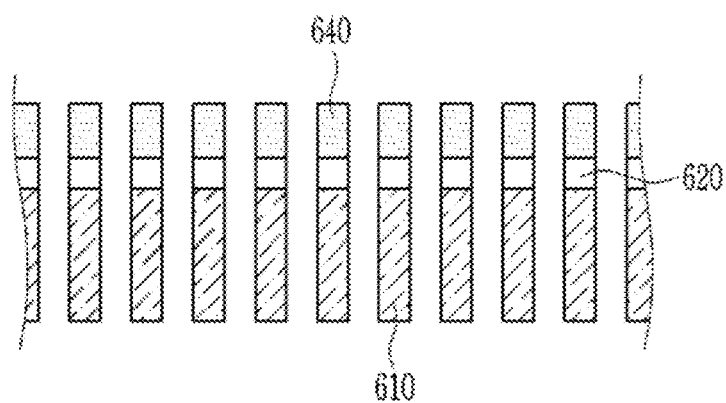

A secondary etching stage for etching the metal layer 610 is performed as shown in FIG. 10. The metal layer 610 not covered by the mask 640 and the metal anti-oxidization layer 620 is completely etched so that the material may not remain on a lower portion. The metal layer 610 that is not etched but remains may be a wire grid polarizer to be described.

The secondary etching stage may use a wet etching scheme for etching the metal layer 610, but the present invention is not limited thereto. For example, various methods for etching the metal layer 610 besides the wet etching scheme may also be used. In addition to the etching process, a process for removing part of the metal layer 610 except for a portion covered by the mask 640 may be included in the performance range of the present invention.

Figure 11:
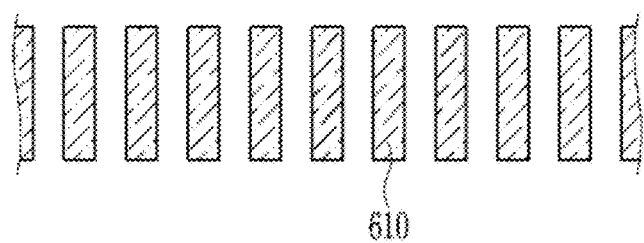

After the etching process is finished, the wire grid polarizer made of a metal layer 610 may be manufactured by removing the metal anti-oxidization layer 620 and the mask 640 remaining on the metal layer 610, as shown in FIG. 11.

Figure 12B:
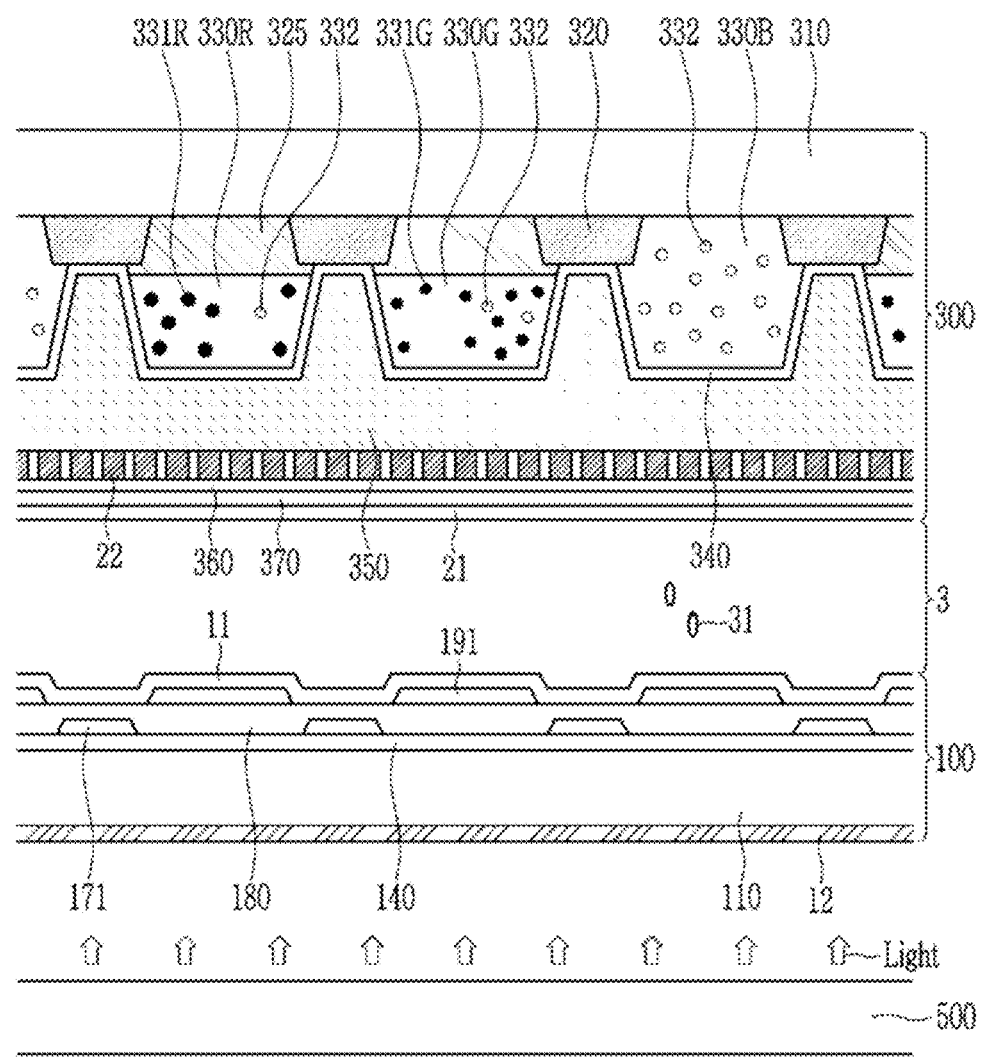

A display device including a wire grid polarizer manufactured through the above-described process will now be described. FIG. 12A shows a top plan view of a display device including a wire grid polarizer, and FIG. 12B shows a cross-sectional view taken along line b-b' of FIG. 12A.

The display device includes a light unit 500, a thin film transistor array panel 100, a color converting display panel 300 overlapping the thin film transistor array panel 100, and a liquid crystal layer 3 provided between the thin film transistor array panel 100 and the color converting display panel 300.

The light unit 500 is provided on a rear side of the thin film transistor array panel 100, and may include a light source for generating light, and a light guide for receiving the light and guiding the received light toward the thin film transistor array panel 100.

The light unit 500 may include any kind of light source emitting blue light, and for example, it may include a light emitting diode (LED). Instead of the light unit 500 including a blue light source, a light unit 500 including a white light source or an ultraviolet light source may be used. However, the display device using a light unit 500 including a blue light source will now be described.

The thin film transistor array panel 100 includes a first polarization layer 12 provided between a first substrate 110 and the light unit 500. The first polarization layer 12 polarizes light input to the first substrate 110 from the light unit 500.

The thin film transistor array panel 100 may include: a gate line 121 extending in a first direction between the first substrate 110 and the liquid crystal layer 3 and including a gate electrode 124; a gate insulating layer 140 provided between the gate line 121 and the liquid crystal layer 3; a semiconductor layer 154 provided between the gate insulating layer 140 and the liquid crystal layer 3; a data line 171 provided between the semiconductor layer 154 and the liquid crystal layer 3 and extending in a second direction crossing the first direction; a source electrode 173 connected to the data line 171; a drain electrode 175 separated from the source electrode 173; and a passivation layer 180 provided between the data line 171 and the liquid crystal layer 3. The source and drain electrodes 173 and 175 are each formed on at least a portion of the semiconductor layer 154. The data line 171 intersects the gate line 121.

The semiconductor layer 154 forms a channel for a thin film transistor (Tr) in a portion not covered by the source electrode 173 and the drain electrode 175, and the gate electrode 124, the semiconductor layer 154, the source electrode 173 and the drain electrode 175 form the thin film transistor (Tr).

A pixel electrode 191 is provided on the passivation layer 180, and may be physically and electrically connected to the drain electrode 175 through a contact hole 185 in the passivation layer 180.

A first alignment layer 11 may be provided between the pixel electrode 191 and the liquid crystal layer 3.

The color converting display panel 300 includes a second substrate 310 overlapping the thin film transistor array panel 100. A light blocking member 320 is provided between the second substrate 310 and the thin film transistor array panel 100. The light blocking member 320 is provided between the second substrate 310 and color converting layers 330R and 330G to be described, and between the second substrate 310 and a transmission layer 330B to be described. The light blocking member 320 may have a lattice or linear shape in a plane view.

A blue light cutting filter 325 may be provided between the second substrate 310, as well as the light blocking member 320, and the thin film transistor array panel 100. The blue light cutting filter 325 may be provided between a red color converting layer 330R and the second substrate 310 and between a green color converting layer 330G and the second substrate 310. The blue light cutting filter 325 may overlap a region emitting red and green colors and may not overlap a region emitting a blue color.

The blue light cutting filter 325 may block the blue light supplied by the light unit 500. The blue light input to the red color converting layer 330R and the green color converting layer 330G from the light unit 500 is changed to the corresponding red and green color, respectively, by semiconductor nanocrystals 331R and 331G, and part of the blue light may not be changed and may be output. The blue light that is output without a change may be mixed with the red or green light to deteriorate the color reproducibility. The blue light cutting filter 325 may block (absorb or reflect) the blue light that is supplied by the light unit 500 and is not absorbed by the red color converting layer 330R and the green color converting layer 330G.

The blue light cutting filter 325 may include any kind of materials for performing the above-described effects, and for example, it may include a yellow color filter. The blue light cutting filter 325 may have a single layer structure or a structure being stacked with multiple layers.

A plurality of color converting layers 330R and 330G and a transmission layer 330B may be provided between the second substrate 310 and the thin film transistor array panel 100. The color converting layers 330R and 330G and the transmission layer 330B may be arranged in the first direction.

The color converting layers 330R and 330G may each transform the incident light into a light that has a different wavelength from the incident light, and may output the same. The color converting layers 330R and 330G may include a red color converting layer 330R and a green color converting layer 330G.

The transmission layer 330B does not transform the incident light, and it may output the incident light as it is. For example, blue light may be input to the transmission layer 330B and may then be output therefrom as it is.

The red color converting layer 330R may include a first semiconductor nanocrystal 331R for transforming the incident blue light into red light. The first semiconductor nanocrystal 331R may include at least one of a fluorescent material and a quantum dot.

The green color converting layer 330G may include a second semiconductor nanocrystal 331G for transforming the incident blue light into green light. The second semiconductor nanocrystal 331G may include at least one of a fluorescent material and a quantum dot.

When the blue light is applied to the quantum dots, the quantum dots will emit light of specific frequencies, and these frequencies can be precisely tuned by changing the dots' size, shape and material. The quantum dots included in the first semiconductor nanocrystal 331R and the second semiconductor nanocrystal 331G may be independently selected from among, for example, a Group II-VI compound, a Group III-V compound, a Group IV-VI compound, a Group IV element, and a Group IV compound, and combinations thereof.

The transmission layer 330B may allow the incident light to pass through, and may include a resin for transmitting the blue light. The transmission layer 330B provided in the region outputting a blue color does not include an additional semiconductor nanocrystal, and allows the incident blue light to pass through as it is.

The transmission layer 330B may further include at least one of a dye and a pigment. The transmission layer 330B including a dye and/or a pigment may reduce the reflection of external light and may provide blue light with enhanced color purity.

At least one of the red color converting layer 330R, the green color converting layer 330G, and the transmission layer 330B may further include a scatterer 332. The contents of respective scatterers 332 included in the red color converting layer 330R, the green color converting layer 330G, and the transmission layer 330B may be different.

The scatterer 332 may increase the amount of light transformed by the color converting layers 330R and 330G and the transmission layer 330B or having passed through the same, and then output, and may uniformly provide front luminance and lateral luminance.

The scatterer 332 may include any kind of materials for uniformly scattering the incident light. Suitable material for the scatterer 332 may be a metal or a metal oxide. The scatterer 332 may exemplarily include at least one of titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), antimony oxide ($Sb_2O_3$), and indium tin oxide (ITO).

A light filter layer 340 is provided between the color converting layers 330R and 330G and an overcoating layer 350 and between the transmission layer 330B and the overcoating layer 350.

The light filter layer 340 may be a filter for transmitting light of a specific wavelength and reflecting or absorbing light excluding the light of a specific wavelength. The light filter layer 340 is provided by alternately stacking a layer with a high refractive index and a layer with a low refractive index, and it may transmit and/or reflect a specific wavelength by using constructive and/or destructive interference.

The light filter layer 340 may include at least one of, for example, titanium oxide ($TiO_2$), silicon nitride ($SiN_x$), silicon oxide ($SiO_y$), titanium nitride (TiN), aluminum nitride (AlN), aluminum oxide ($Al_2O_3$), tin oxide ($SnO_2$), tungsten oxide ($WO_3$), and zirconium oxide ($ZrO_2$), and for example, it may be a configuration generated by alternately stacking $SiN_x$ and $SiO_y$. In $SiN_x$ and $SiO_y$, x and y are factors for determining a chemical composition ratio, and they are controllable according to a processing condition for forming layers.

The overcoating layer 350 is provided between the light filter layer 340 and the thin film transistor array panel 100, and may overlap a front side of the second substrate 310.

The overcoating layer 350 may smooth one side of each of the red color converting layer 330R, the green color converting layer 330G, and the transmission layer 330B. The overcoating layer 350 may include an organic material, however, the present invention is not limited thereto. For example, any kind of materials for performing a smoothing function may be used to form the overcoating layer 350.

A second polarization layer 22 may be provided between the overcoating layer 350 and the liquid crystal layer 3. The second polarization layer 22 may be the above-described wire grid polarizer. Thus, no additional detailed description thereof will be provided.

An insulating layer 360, a common electrode 370, and a second alignment layer 21 are provided between the second polarization layer 22 and the liquid crystal layer 3.

The insulating layer 360 insulates the metallic second polarization layer 22 and the common electrode 370, and it may be omitted when the second polarization layer 22 is not made of a metal. The common electrode 370 for receiving a common voltage may form an electric field with the above-described pixel electrode 191. The present exemplary embodiment describes the configuration in which the common electrode 370 is provided on a display panel that is different from that of the pixel electrode 191, however, the present invention is not limited thereto. For example, the common electrode 370 and the pixel electrode 191 may be provided on the same display panel.

The liquid crystal layer 3 is provided between the thin film transistor array panel 100 and the color converting display panel 300, and includes a plurality of liquid crystal molecules 31. Transmittance of the light received from the light unit 500 is controllable according to a movement of the liquid crystal molecules 31.

The display device may include a uniform second polarization layer 22, so reliability of the device may be enhanced.

Figure 13:
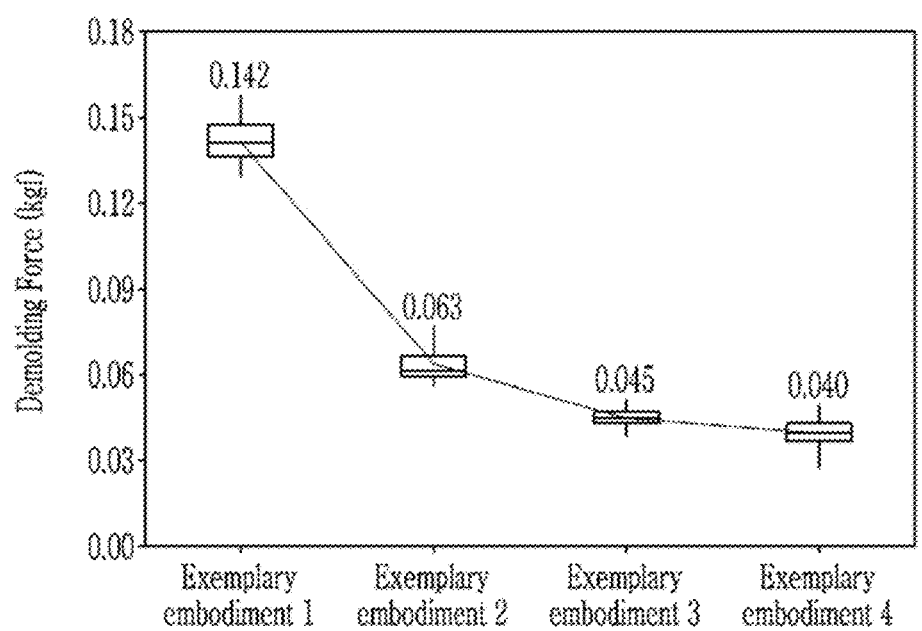
FIG. 13 shows a graph indicating a demolding force according to an exemplary embodiment of the present invention.
Figure 15:
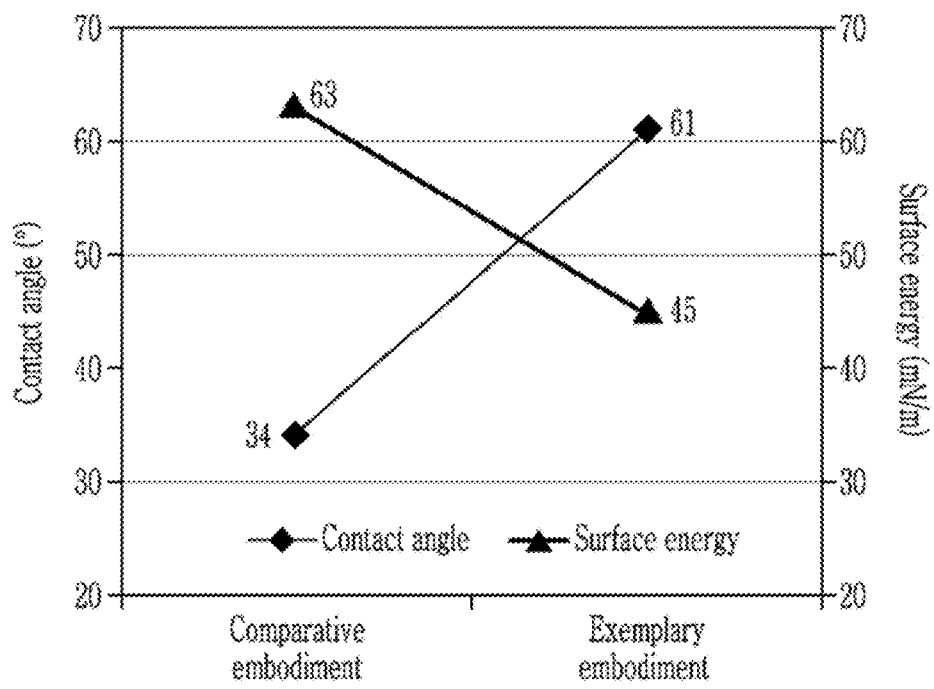
FIG. 15 shows a graph of a surface characteristic change of a hard mold according to an exemplary embodiment of the present invention.
Figure 16:
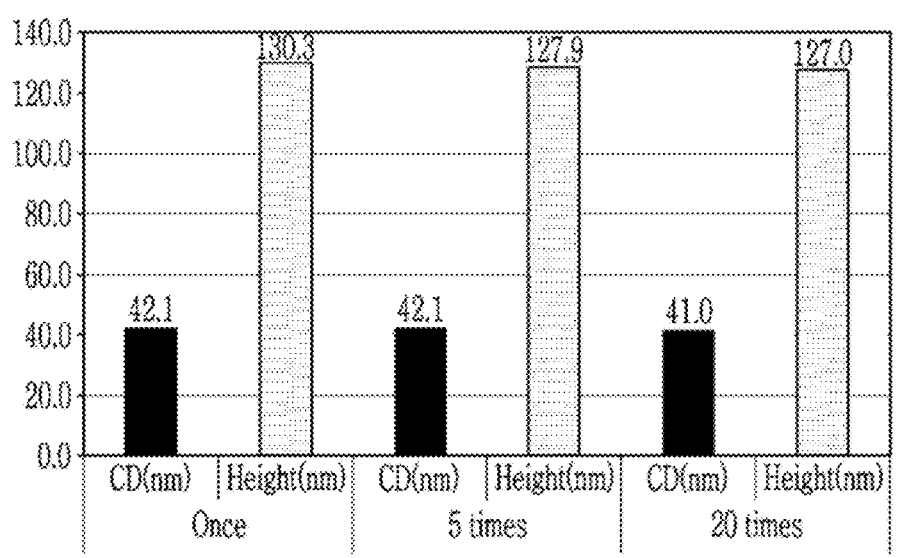
FIG. 16 shows a graph of a form of a wire grid polarizer manufactured according to an exemplary embodiment of the present invention.
Figure 17:
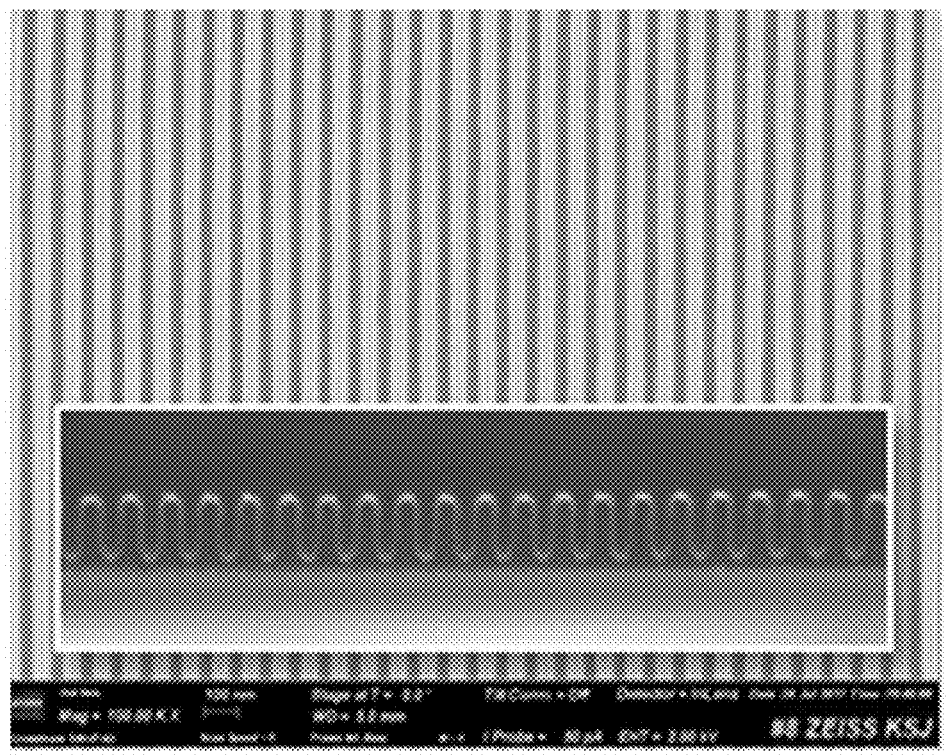
FIG. 17, FIG. 18 and FIG. 19 are each respectively an image of a wire grid polarizer manufactured according to an exemplary embodiment of the present invention.
Figure 18:
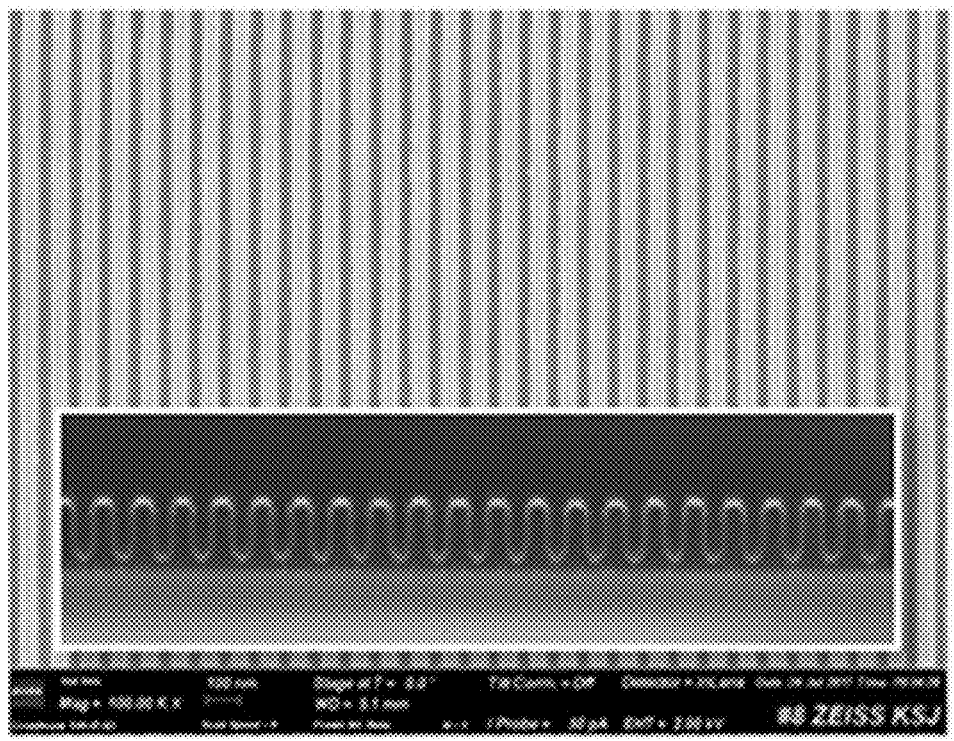
Figure 19:
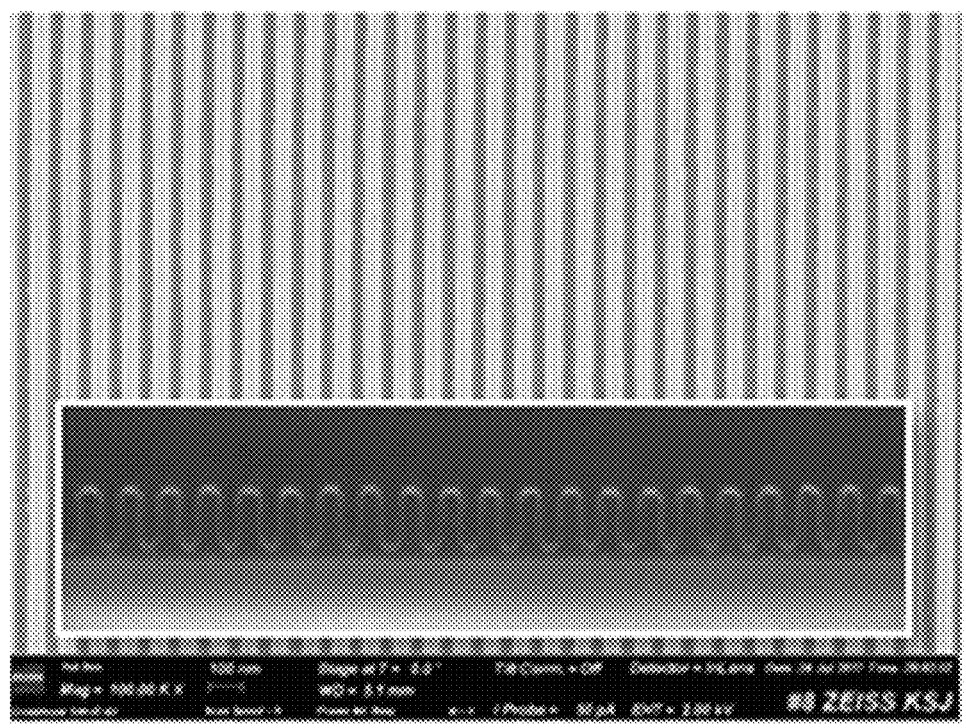

A mold for a wire grid polarizer according to an exemplary embodiment of the present invention and a comparative example will now be described with reference to FIG. 13 to FIG. 20. FIG. 13 shows a graph indicating a demolding force according to an exemplary embodiment of the present invention, FIG. 14 shows a graph indicating a surface characteristic of a mold according to an exemplary embodiment of the present invention and a comparative example, FIG. 15 shows a graph of a surface characteristic change of a hard mold according to an exemplary embodiment of the present invention, FIG. 16 shows a graph of a form of a wire grid polarizer manufactured according to an exemplary embodiment of the present invention, and FIG. 17, FIG. 18 and FIG. 19 are each respectively an image of a wire grid polarizer manufactured according to an exemplary embodiment of the present invention.

Regarding FIG. 13, demolding forces for 4 soft molds formed with 4 different additives included in the resins for forming the soft molds are shown. Exemplary embodiment 1 represents a case in which a resin for a soft mold including an additive represented by Formula 1 is used, Exemplary embodiment 2 represents a case in which a resin for a soft mold including an additive represented by Formula 2 is used, Exemplary embodiment 3 represents a case in which a resin for a soft mold including an additive represented by Formula 3 is used, and Exemplary embodiment 4 represents a case in which a resin for a soft mold including an additive represented by Formula 4 is used.

Regarding the Exemplary embodiments shown in FIG. 13, it may be found that a demolding force is reduced in the process for manufacturing a soft mold and separating the soft mold from a hard mold. Particularly, it is found that it becomes easy to separate the soft mold from the hard mold by including an additive, and that it becomes easier to separate the soft mold from the hard mold as a carbon chain of the additive becomes longer.

Figure 14:
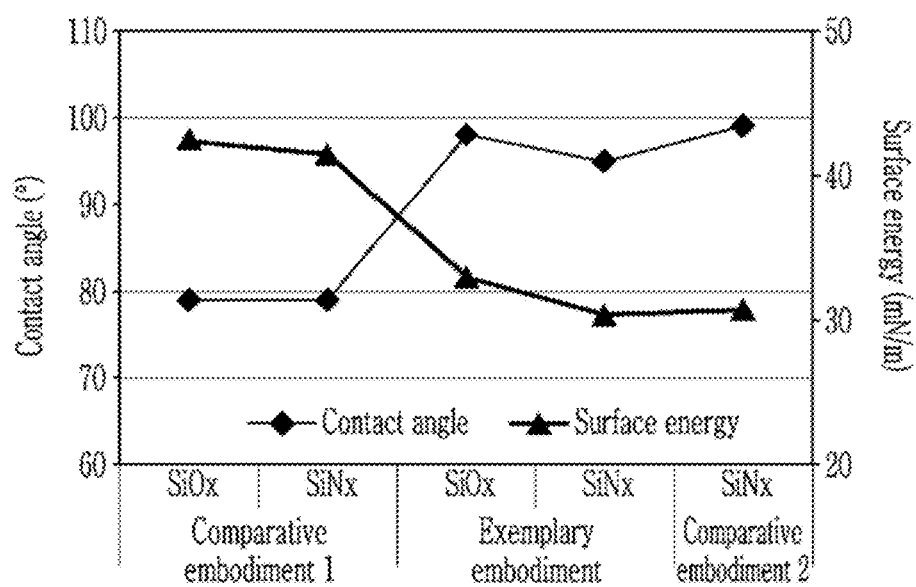
FIG. 14 shows a graph indicating a surface characteristic of a mold according to an exemplary embodiment of the present invention and a comparative example.

Referring to FIG. 14, in the case of Comparative embodiment 1 including no additive, it is found that surface energy of a mold is about 42 mN/m, and a contact angle with de-ionized water (DI) is about 80 degrees. On the contrary, in the case of Exemplary embodiment including an additive, it is found that the surface energy of a mold reduces to be below about 33 mN/m and the contact angle is equal to or greater than about 95 degrees. It is found that the surface of the mold according to the Exemplary embodiment has a hydrophobic property compared to that of the Comparative embodiment 1.

In addition, the case of Comparative embodiment 2 represents a mold generated by performing a SAM surface treatment on the soft mold of Comparative embodiment 1. The Comparative embodiment 2 shows equivalent levels as the surface energy and the contact angle according to the Exemplary embodiment. The mold according to the Exemplary embodiment has low surface energy and an excellent release force without a SAM surface treatment, thereby indicating a surface characteristic with a high contact angle.

Referring to FIG. 15, in the case of Comparative embodiment, the hard mold has a contact angle of about 34 degrees and surface energy of about 63 mN/m after the soft mold including no additive is manufactured and separated. On the contrary, in the case of Exemplary embodiment, it is found that the hard mold has surface energy of about 45 mN/m and a contact angle of about 61 degrees after the soft mold including an additive is manufactured and separated. This is because the additive forms a layer on the hard mold in the process for manufacturing a soft mold according to the Exemplary embodiment to have the same effect as if the hard mold has undergone a SAM surface treatment. It is found that the release force (demolding force) between the hard mold and the soft mold may decrease in the case of Exemplary embodiment.

A width (CD) and a height of a wire grid polarizer manufactured by using a soft mold according to an exemplary embodiment of the present invention will now be described with reference to FIG. 16.

When the soft mold is used once, an average width of a bar included in the wire grid polarizer is 42.1 nm, and an average height is about 130.3 nm. The wire grid polarizer manufactured after using the soft mold once shows an image like that of FIG. 17. When the soft mold is used five times, the average width of the bar is about 42.1 nm and the average height is about 127.9 nm. The wire grid polarizer manufactured after using the soft mold five times shows an image like that of FIG. 18. Also, when the soft mold is used twenty times, the average width of the bar is about 41.0 nm and the average height is about 127.0 nm. The wire grid polarizer manufactured after using the soft mold twenty times shows an image like that of FIG. 19. It is found that the form or shape of the manufactured wire grid polarizer is almost the same when the soft mold according to an exemplary embodiment of the present invention is used a plurality of times.

Figure 20:
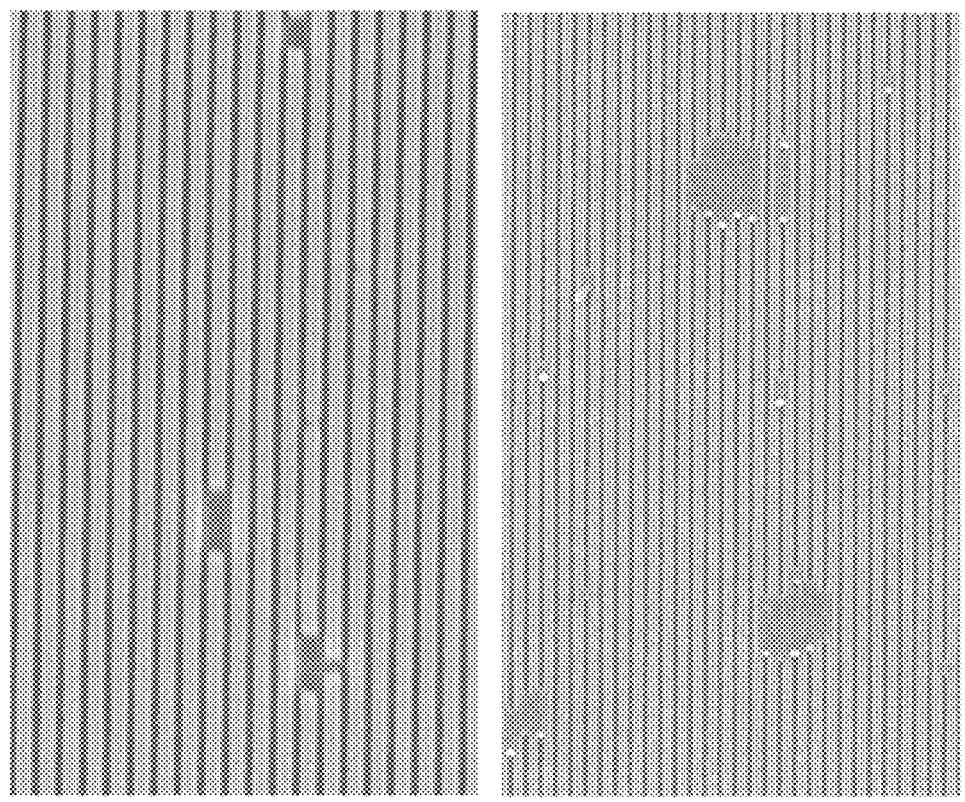
FIG. 20 shows an image of a wire grid polarizer manufactured according to a comparative example.

On the contrary, with the hard mold and the soft mold according to a comparative example as shown in FIG. 20, it is found that durability and release force are deteriorated according to a repeated process, so protrusions and depressions of the soft mold may be damaged or the pattern of the wire grid polarizer may be damaged.

Table 1 shows forces (kgf) for separating a soft mold in respective processes using the soft mold multiple times according to an exemplary embodiment of the present invention and a comparative example.

TABLE 1

|  | Once | 5 times | 20 times |
| --- | --- | --- | --- |
| Comparative Example | 0.044 kgf | 0.071 kgf | 0.081 kgf |
| Exemplary Embodiment | 0.032 kgf | 0.032 kgf | 0.036 kgf |

Referring to Table 1, it is found that, according to an exemplary embodiment of the present invention, the force for separating an imprinting resin from a soft mold does not substantially increase when the soft mold is used multiple times. On the contrary, it is found that, according to a comparative example, the release force of about 0.044 kgf is shown when the imprinting is performed once, and the release force of about 0.081 kgf is shown when the imprinting is performed about twenty times. That is, the release force almost doubles after twenty times, and according to this, the imprinting resin may remain on the soft mold in the process for separating the soft mold.

While the present invention has been described in connection with what is presently considered to be practical exemplary embodiments, it is to be understood that the present invention is not limited to the disclosed embodiments, but, on the contrary, is intended to cover various modifications and equivalent arrangements included within the spirit and scope of the appended claims.

What is claimed is:

1. A mold for a wire grid polarizer comprising:
   a hard mold and a soft mold,
   wherein the hard mold comprises:
      a main body;
      an oxidization layer provided on the main body; and
      a SAM layer provided on the oxidization layer and including an additive,
   the soft mold comprises:
      a substrate; and
      a protrusions and depressions portion including a polymerized releasing agent, and
   a region that is hydrophobic in the polymerized releasing agent is arranged on a surface of the protrusions and depressions portion.

2. The mold for the wire grid polarizer of claim 1, wherein the additive includes a first region that is hydrophilic and a second region that is hydrophobic.

3. The mold for the wire grid polarizer of claim 2, wherein the first region is provided near the oxidization layer, and the second region is arranged on a surface of the hard mold.

4. The mold for the wire grid polarizer of claim 3, wherein the oxidization layer is hydrophilic.

5. The mold for the wire grid polarizer of claim 1, wherein the main body comprises at least one of a silicon oxide, a silicon nitride, and a metal.

6. The mold for the wire grid polarizer of claim 1, wherein the additive comprises at least one of compounds represented by Formula 1 to Formula 4:

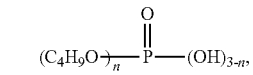
[Formula 1]

[Formula 2]

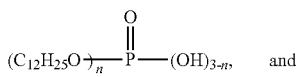
[Formula 3]

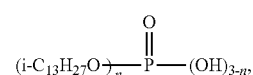
[Formula 4]

where n is 1 or 2.

7. The mold for the wire grid polarizer of claim 1, wherein the polymerized releasing agent comprises at least one of a fluorocarbon oligomer, a fluorocarbon polymer, a siloxane oligomer, and a siloxane polymer.

8. The mold for the wire grid polarizer of claim 1, wherein the oxidization layer is physically combined with the SAM layer.

9. A method for manufacturing a mold for a wire grid polarizer, the method comprising:
preparing a main body for a hard mold;
applying a resin for a soft mold on the main body; and
forming the soft mold by curing the resin for the soft mold and separating the soft mold,
wherein the resin for the soft mold applied on the main body comprises a releasing agent and an additive,
the additive is arranged near the main body,
the releasing agent is arranged by the additive in such a way that their regions adjacent to each other have a same hydrophilic or hydrophobic property, and
the separating of the soft mold comprises forming a SAM layer including the additive on the main body.

10. The method of claim 9, further comprising forming an oxidization layer on the main body.

11. The method of claim 10, wherein a surface of the oxidization layer is hydrophilic.

12. The method of claim 11, wherein
the additive comprises a first region that is hydrophilic and a second region that is hydrophobic, and
the first region is arranged to be adjacent to the surface of the oxidization layer.

13. The method of claim 12, wherein
the releasing agent comprises a first region including a photoreactive group and a second region that is hydrophobic, and
the second region of the releasing agent is arranged to be adjacent to the second region of the additive.

14. The method of claim 9, wherein
while the releasing agent and the additive are arranged, the resin for the soft mold is cured.

15. The method of claim 14, wherein
the curing of the resin for the soft mold comprises allowing a photoreactive group included in the releasing agent to perform a polymerizing reaction.

16. The method of claim 9, wherein
the additive comprises at least one of compounds represented by Formula 1 to Formula 4:

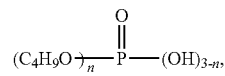
[Formula 1]

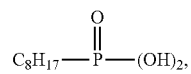
[Formula 2]

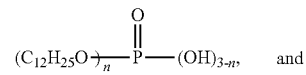
[Formula 3]

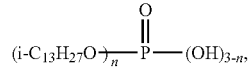
[Formula 4]

where n is 1 or 2.

17. The method of claim 9, wherein
the additive does not comprise a reactive group.

18. The method of claim 9, wherein
the releasing agent comprises at least one of a fluorocarbon oligomer, a fluorocarbon polymer, a siloxane oligomer, and a siloxane polymer.

19. The method of claim 10, wherein
the oxidization layer is physically combined with the SAM layer.

* * * * *